United States Patent [19]

Terada et al.

[11] Patent Number: 4,875,005
[45] Date of Patent: Oct. 17, 1989

[54] MECHANISM FOR TURNING OVER A TEST HEAD OF A WAFER PROBING MACHINE

[75] Inventors: Michimasa Terada, Tokyo; Hisashi Nakajima, Yamanashi, both of Japan

[73] Assignee: Tokyo Electron Limited, Tokyo, Japan

[21] Appl. No.: 228,491

[22] Filed: Aug. 5, 1988

[30] Foreign Application Priority Data

Aug. 7, 1987 [JP] Japan .................................. 62-199538

[51] Int. Cl.$^4$ ........................ G01R 31/02; B25B 11/00
[52] U.S. Cl. ............................ 324/158 F; 324/73 PC; 414/758; 414/917
[58] Field of Search ........... 324/158 F, 158 P, 73 PC; 414/752, 758, 778, 783, 917

[56] References Cited

U.S. PATENT DOCUMENTS 4,411,587 10/1983 Niki ..................................... 414/752
4,715,775 12/1987 Amino .................................. 414/758

FOREIGN PATENT DOCUMENTS

3524348 1/1987 Fed. Rep. of Germany ... 324/158 F
59-2182 1/1984 Japan .

Primary Examiner—Ernest F. Karlsen
Attorney, Agent, or Firm—Oblon, Spivak, McClelland, Maier & Neustadt

[57] ABSTRACT

A mechanism according to the present invention comprises a quadric crank chain disposed substantially within a vertical plane to support a test head of wafer probing machine, a cylinder mechanism coupled to a first movable link corresponding to the side opposite to a fixed link of the quadric crank chain, the cylinder mechanism serving to slide the first movable link in a vertical direction, and a guide member for supportingly guiding the cylinder mechanism in a horizontal direction. The test head is attached to a second movable link, which corresponds to a side adjacent to the fixed link of the quadric crank chain, so that the test head, along with the second movable link, revolves within the vertical plane when the first movable link slides vertically.

16 Claims, 7 Drawing Sheets

MECHANISM FOR TURNING OVER A TEST HEAD OF A WAFER PROBING MACHINE

BACKGROUND OF THE INVENTION

1. Field of the Invention

The present invention relates to a mechanism for turning over a heavyweight object, e.g., a test-head, for 180° so that it is turned upside down, in processes for manufacturing semiconductor devices, such as ICs, LSIs, etc., and more particularly, to a mechanism for rotatively transferring a high-frequency test head of wafer probing machine used in wafer tests for individually checking device patterns of semiconductor wafers.

2. Description of the Related Art

Semiconductor devices, such as ICs and LSIs, are subjected to several evaluation tests for their characteristics during their manufacturing processes. A wafer test process, which is a process for an electrical examination for each device pattern, is executed between a wafer test forming process and an assembly process, that is, after pretreatment processes, such as pattern etching and protective film coating.

A wafer test is intended to reject defective devices while they are each in the form of a wafer, and to feed test results back to the preceding process, thereby improving the yield and reliability of products.

A wafer test system basically comprises two apparatuses, a wafer probing machine (referred to also as a wafer prober) and a tester. These two apparatuses are connected to each other by means of a measuring line, and a test complete signal, fail signal, etc. are transferred between them in response to a test start command from a test control line.

In order to speed up tests, newly developed wafer test systems use a test head capable of high-frequency measurement, thereby shortening the measuring line and reducing the measuring time required.

The test head, which is in the form of a box, is supported on a wafer prober by means of a rotating mechanism. During a test, a performance board of the head is opposed to the top face of the prober. When the test head is off the test, it is rotated for 180° so as to be turned upside down. The head contains a number of components, such as a high-frequency oscillator, and wires. If the number of pads on a device pattern increases, then the contained components and wires usually increase in number in proportion. Thus, the test head must be a large-sized, weighty object. A test head for probing high-integration devices, in particular, weighs extremely heavy. If its pins are 45 in number, for example, the head of this type weighs 25 kg or thereabout. If 256 pins are used, however, the head may be as heavy as about 100 kg.

Accordingly, the efficiencies of needle alignment (for contact between probe needles and their corresponding pads) and probe card replacement become too low to readily cop with the diversity of the test program. Thus, the test speed is lowered, as a whole. Since the test head is considerably heavy, moreover, it is very difficult to manually control its transfer.

In order to eliminate these awkward situations, mechanization of drive means for the test head rotating mechanism has been studied variously. Reversing mechanisms of a balance-weight type and a spring type have hitherto started to be practically used.

Figure 1:
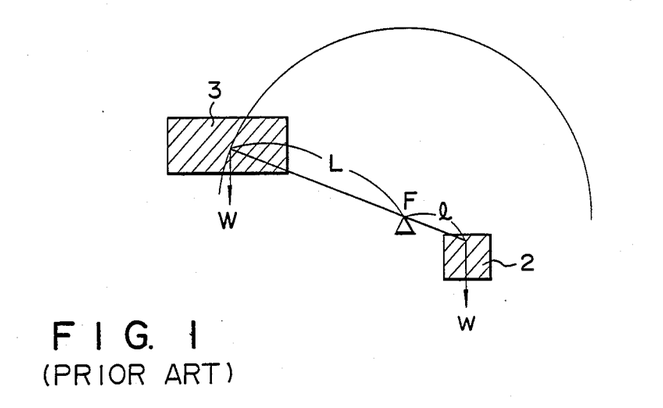
FIG. 1 is a schematic view showing a prior art mechanism of a balance-weight type.

As shown in FIG. 1, a reversing mechanism of the balance-weight type is constructed so that weight 2 and test head 3 ar balanced with each other at point F. According to the balance-weight system, however, the total weight of the machine is increased, and the mechanism requires a wide installation space. Thus, the machine becomes heavier and bulkier. Since the weight of the test head varies depending on the type of subject devices, moreover, the balance between weight 2 and test-head is variety.

According to a reversing mechanism of the spring type, on the other hand, the machine can be reduced in weight. Like the mechanism of the aforesaid balance-weight type, however, the spring-type mechanism cannot smoothly revolve the test head throughout the stroke, and cannot, therefore, enjoy high operating efficiency. Furthermore, the force for supporting the test-head by the mechanism is poor, because the machine becomes heavier.

SUMMARY OF THE INVENTION

The object of the present invention is to provide a mechanism capable of smoothly turning over a test head of wafer probing machine in any posture, especially a lightweight, small-sized mechanism with high operating efficiency.

According to an aspect of the present invention, there is provided a mechanism for turning over a heavyweight object, which comprises a quadric crank chain disposed substantially within a vertical plane to support an object of transfer, slide means coupled to a first movable link corresponding to the side opposite to a fixed link of the quadric crank chain, the sliding means serving to slide the first movable link in a vertical direction, and guide means for supportingly guiding the slide means in a horizontal direction, the object of transfer being attached to a second movable link corresponding to a side adjacent to the fixed ink of the quadric crank chain, so that the object of transfer, along with the second movable link, revolves within the vertical plane when the first movable link slides vertically.

In this case, various weighty objects can be revolved within a vertical plane by means of the rotary transfer mechanism. The rotary transfer mechanism is adapted particularly for the rotary transfer of a high-frequency test head of a wafer probing machine.

In this case, moreover, the second movable link, with the object of transfer thereon, may be coupled to the upper or lower side of the fixed link. Preferably, however, it should be connected to the upper side of the fixed link.

Preferably, furthermore, the slide means is formed of a cylinder mechanism, which is provided with means for controlling the amount of fluid supply to the cylinder mechanism so that a load on the cylinder mechanism is substantially constant. In this case, oil, water, or air may be used as a fluid for operating the cylinder mechanism. Preferably, however, air should be used for this purpose. Preferably, moreover, the cylinder mechanism is provided with a control device for controlling the fluid pressure, which includes a regulator, a solenoid valve, a relief valve, and a pressure sensor.

In this case, furthermore, a timing belt is preferably attached to the fixed link of the quadric crank chain. More specifically, a ratchet wheel is mounted on a pivotal shaft which connects the fixed link and the second movable link, and is caused to engage the timing belt so that the quadric crank chain can operate accurately and securely. Preferably, moreover, the ratchet wheel on the pivotal shaft is provided with a lock mechanism, which serves as a safety device when the driving force of the slide means is lost. In this case, the lock mechanism is preferably operated in accordance with the pressure detected by the pressure sensor of the fluid supply means.

DETAILED DESCRIPTION OF THE PREFERRED EMBODIMENTS

Various embodiments of the present invention will now be described in detail with reference to the accompanying drawings.

Figure 2:
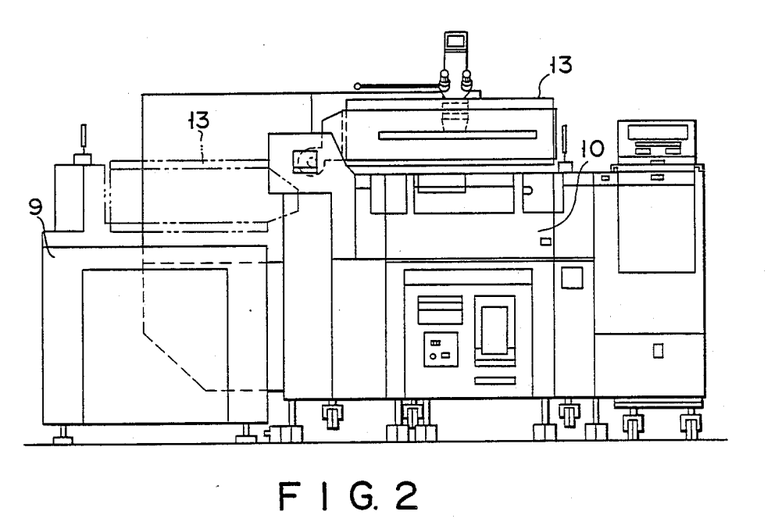
FIG. 2 is a front view showing a wafer probing machine (wafer prober) and a test head.

As shown in FIG. 2, fully automatic wafer probing machine (prober) 10 for testing semiconductor wafers is installed on a floor with the aid of a damping member. The prober 10 has high-frequency test head 13 mounted on it. When it is in test, head 13 is opposed to each chip in a wafer on prober 10, as indicated by full line. When it is not in test, the test head can be placed on side desk 9, as indicated by two-dot chain line. Prober 10 comprises various members, such as a cassette table, wafer transfer unit, loader/unloader unit, auto-alignment mechanism, XYZθ-stage, inker drive unit, insert ring probe card, etc.

Figure 3:
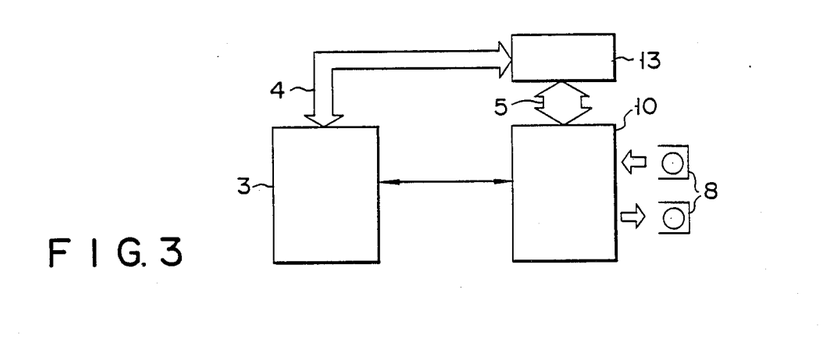
FIG. 3 is a schematic view for illustrating a wafer test system.

Referring now to FIG. 3, an outline of a wafer test system will be described.

The wafer test system is composed of two apparatuses, tester 3 and prober 10. Tester 3 is of an electric type and is connected to test head 13 by means of measuring line 4. Cables of line 4, which correspond in number to electrodes (bonding pads) of a testing object, are connected directly to tester 3, extending from the probe card. Machine 10 and test head 13 are connected to each other by means of wiring 5 inside the insert ring. Wafer cassette 8 can be loaded into or unloaded from the cassette table of machine 10. More specifically, when cassette 8 enters the cassette table, only one of wafers in the cassette are drawn out therefrom to be placed onto a chuck top via the wafer transfer unit, loader/unloader unit, and auto-alignment mechanism, in succession. The chuck top is mounted on the XYZθ-stage which is provided with a pulse motor. The wafer is aligned by means of the XYZθ-stage. The probe card is set in a head plate by means of the insert ring so that its probe is opposed to the wafer on the chuck top during a test. When the card and the probe face each other, θ-adjustment and needle alignment are performed automatically. Thus, test head 13 is formed integral with the probe card to establish the aforementioned facing relation.

Figure 4:
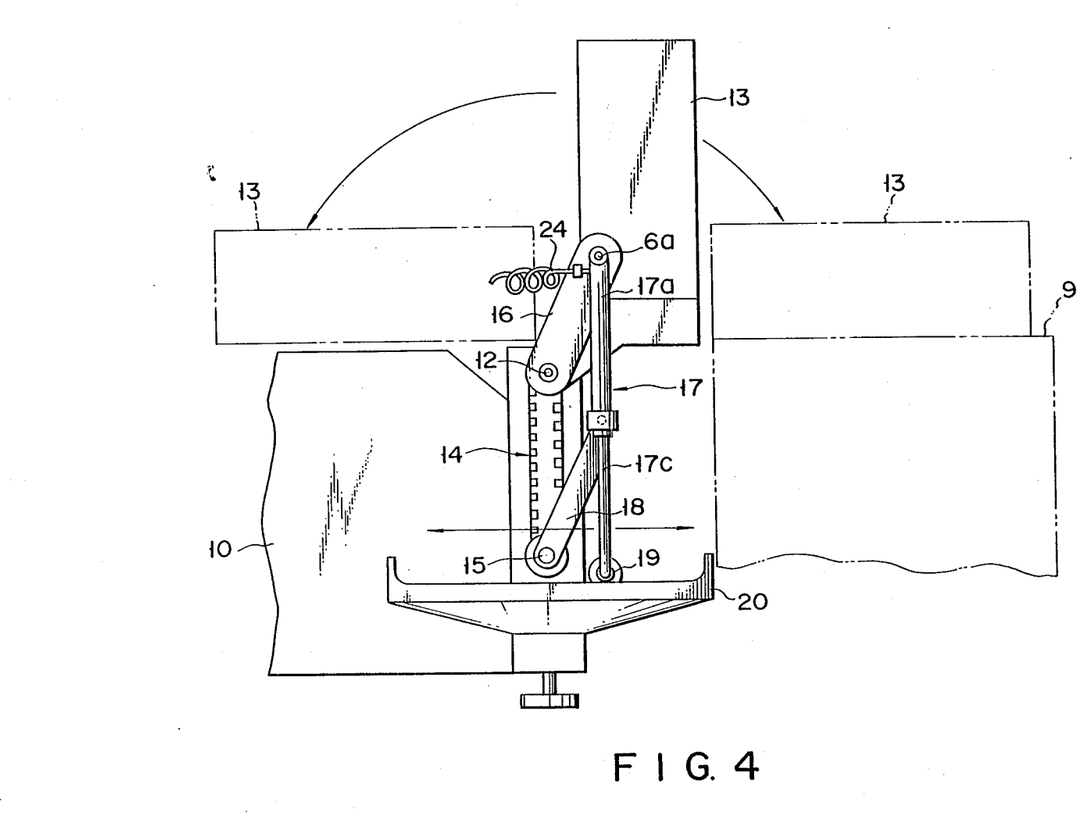
FIG. 4 is a rear view of a mechanism according to a first embodiment of the present invention, illustrating the way a test head is mounted on a wafer prober.
Figure 5:
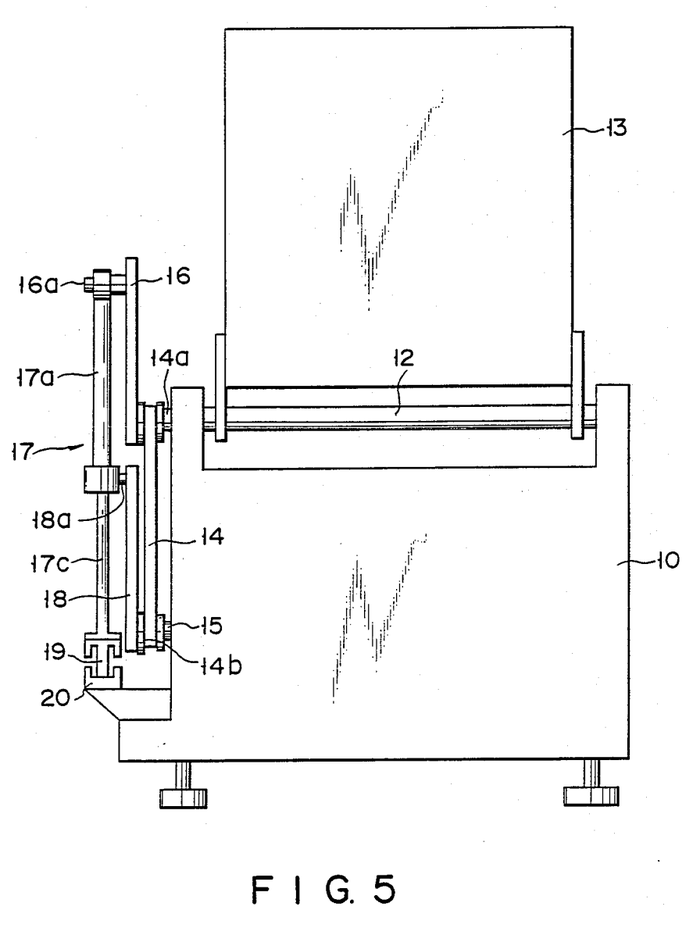
FIG. 5 is a side view of the mechanism for turning over the test head shown in FIG. 4.

As shown in FIGS. 4 and 5, rotating shaft 12 extends horizontally at the upper portion of the flank of probing machine 10, and aforementioned test head 13 is mounted for revolution around shaft 12. One end of shaft 12 upwardly projects at the front side of a casing of prober 10. Directly under the projecting end portion of rotating shaft 12, fixed shaft 15 protrudes from the front of the casing and is fixed on the other end of a link mechanism containing shaft 12. (Thus, shaft 15 and the projecting end portion of shaft 12 are aligned vertically.) Flanged belt pulleys 14a and 14b are fixed to the projecting end portions of shafts 12 and 15, respectively, and timing belt 14 is stretched between pulleys 14a and 14b. Projections and indentations are formed like gear teeth on the inner peripheral surface of belt 14.

One end portion of link 16 is rotatably coupled to rotating shaft 12 by means of shaft 16a, while the other end of link 16 is rotatably connected to the upper end portion of cylinder mechanism 17. In this case, mechanism 17 extends parallel to timing belt 14.

Figure 6:
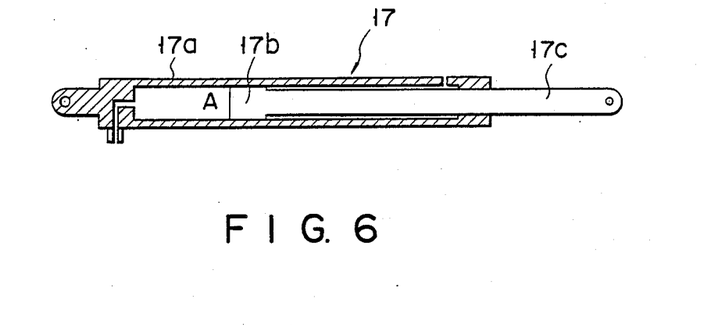
FIG. 6 is a sectional view showing a cylinder mechanism of the mechanism according to the first embodiment.

As shown in FIG. 6, the upper portion of cylinder mechanism 17 consists essentially of cylinder 17a, piston 17b, and piston rod 17c, and is rotatably coupled, at the top portion of cylinder 17a, to link 16.

One end portion of link 18 is rotatably coupled to fixed shaft 15, while the other end portion thereof is rotatably connected to the bottom portion of cylinder 17a. Link 18 extends parallel to link 16. Timing belt 14, cylinder mechanism 17, and links 16 and 18 constitute a quadric crank chain, that is so ay, a parallel crank mechanism.

Roller 19 is mounted on the lower end portion of rod 17c of cylinder mechanism 17. It is adapted to rotate along guide rail 20, which is fixed to machine 10, so that the whole cylinder mechanism is guided in the horizontal direction.

Figure 7:
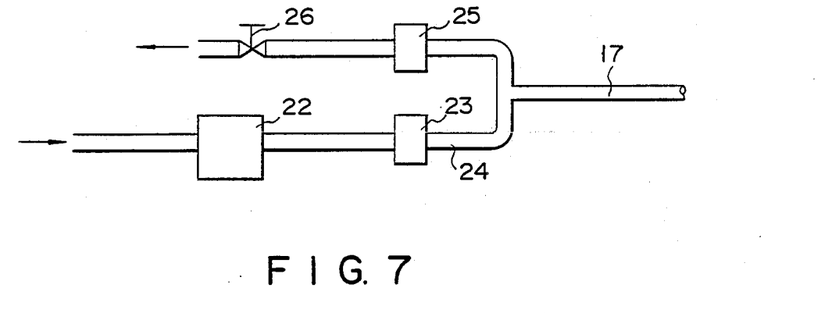
FIG. 7 is a circuit diagram for illustrating the input/output flow of air for the automatic control of the mechanism according to the first embodiment.

FIG. 7 shows an example of means for supplying air to cylinder mechanism 17. Air fed from a source of air supply (not shown) flows through pipe 24 to be introduced into mechanism 17 via regulator 22, by the on-off operation of solenoid valve 23. By the on-off operation of solenoid valve 25 and flow regulating valve 26, on the other hand, the fluid in cylinder mechanism 17 is discharged.

Figure 8:
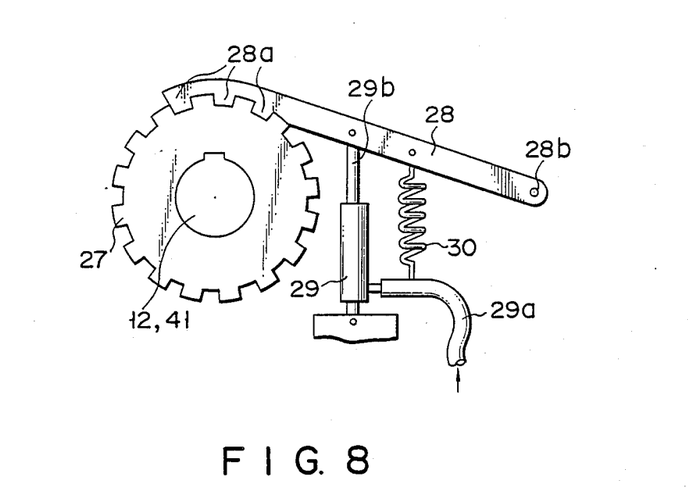
FIG. 8 is a schematic view for illustrating a lock mechanism for a test head rotating shaft of the mechanism according to the first embodiment.

As shown in FIG. 8, an automatic lock mechanism is attached to rotating shaft 12 of a mechanism for turning over the test head. The proximal end of lever 28 of the lock mechanism is rockably supported by pivotal shaft 28b, and rod 29b of cylinder 29 is coupled to lever 28. Lever 28 is adapted to swing when rod 29b projects or withdraws. Compressed air is supplied from the air source to cylinder 29 through pipe 29a. The air source is used in common for cylinder 29 and cylinder mechanism 17. More specifically, cylinder 29 and cylinder 17a of the aforementioned cylinder mechanism are supplied with air from the same source of supply, and are operated in association with each other. In this case, a hydraulic mechanism may be employed which supplies the cylinders with compressed oil in place of the compressed air as the working fluid.

A plurality of pawls 28a are formed on the distal end portion of lever 28. Lever 28 is urged toward shaft 12 by spring 30. Thus, when cylinder 29 is not supplied with air, pawls 29 are caused to engage ratchet wheel 27 of on shaft 12 by the urging force of spring 30. When cylinder 29 is supplied with air, pawls 28a are disengaged from wheel 27.

The following is a description of a wafer test using the wafer probing machine having the rotary transfer mechanism mentioned above.

When preparations for the test, such as the maintenance of the probe card, are finished, the compressed air is supplied to cylinder mechanism 17, thereby causing rod 17c to project. The moment rod 17c projects, the compressed air is supplied also to cylinder 29 of the lock mechanism, so that rod 29b projects, and pawls 28a are disengaged from ratchet wheel 27, thus freeing shaft 12. Thereupon, the quadric crank chain becomes shiftable, so that link 16 rotates around shaft 12, and test head 13 revolves counterclockwise from the side of side desk 9 toward prober 10. At this time, timing belt 14 rotates without slipping on belt pulleys 14a and 14b, so that shafts 12 and 15 rotate securely in synchronism with each other. Thus, during the turning upside down of head 13, links 16 and 18 are kept parallel to each other, and cylinder mechanism 17 never fails to be in a vertical posture. As roller 19 at the lower end of rod 17c is guided by rail 20, mechanism 17 moves horizontally toward machine 10 while being kept vertical.

When links 16 and 18 pass the change point of the quadric crank chain, solenoid valves 23 and 25 are switched to discharge the air gradually from cylinder mechanism 17. Thus, test head 13 is put opositely on the top surface of machine 10 while rod 17c is being gradually withdrawn into cylinder 17a. Preferably, in this case, auxiliary drive means, including a motor or air cylinder, should be additionally used as means for determining the moving direction (clockwise or counterclockwise) of head 13 when the change point is reached by links 16 and 18. During the rotary transfer of test head 13, most of its weight acts on cylinder mechanism 17.

When test head 13 reaches a predetermined test position, it is fixedly clamped by means of a clamp member (not shown).

Test head 13 is coupled to the head plate on the machine side by means of a pogo pin of the insert ring, and is connected electrically to the probe card through the insert ring.

Subsequently, the wafer cassette is set in machine 10, a power switch is turned on, and the probe card is inserted into an input section of the machine. By doing this, one of the wafers is drawn out from the cassette by the action of an actuator of a fully automatic transfer system, and is delivered to a main chuck in the center of the machine 10. When the wafer is placed on the chuck top, the $\theta$-alignment is performed by the auto-alignment mechanism, and then, the XYZ-stage is actuated for XYZ-direction alignment of the wafer. Thereafter, probe needles of the probe card are aligned individually with pads of a device pattern. After the alignment of the wafer is finished, a high frequency is produced by means test head 13 to conduct short-distance tests. When a test for one pattern ends, a test complete signal is delivered from tester 3 to machine 10. In response to this signal, the XYZ-stage operates to align the needles for the next pattern. If a defective pattern is detected as a result of the test, a fail signal is delivered from tester 3 to machine 10. Thereupon, the defective pattern is marked by means of an inker. All these operations are performed automatically in machine 10, and require no manual control except at the time of maintenance or inspection of the machine or replacement of the probe card.

The following is a description of the way test head 13 is rotatively transferred from the side of machine 10 to the side of side desk 9 for the replacement of the probe card. First, the clamp is disengaged, and the compressed air is then supplied to cylinder 29 of the lock mechanism to unlock shaft 12. At the same time, the compressed air is also supplied to cylinder mechanism 17 to project rod 17c. When rod 17c is projected in this manner, it then moves horizontally along rail 20 toward side desk 9, so that the quadric crank chain is shifted. In this case, links 16 and 18 swing in the clockwise direction of FIG. 4, so that test head 13 moves from the side of machine 10 to the side of desk 9. Thereafter, head 13 is placed on desk 9, shaft 12 of link 16 is locked, the probe card is drawn out of the insert ring, and a new probe card is set in place.

According to the first embodiment described above, the high-frequency test head, a heavyweight object, can be handled with ease. Therefore, even if the object is a large-sized heavyweight object, such as a test head for high-density patterns, the maintenance or inspection of the prober and the replacement of the probe card can be accomplished quickly and securely. Thus, the wafer test can be speeded up.

According to the foregoing embodiment, moreover, the compressed air is supplied to the cylinder so that pressure P acting on piston 17b of cylinder mechanism 17 is kept constant. Therefore, piston 17b can be slid smoothly at any position within the stroke. Thus, test head 13 can be revolved smoothly despite the change of its posture during its movement. If the inside diameter of the cylinder and pressure P, for example, are 5.0 cm and 5.0 kg/cm$^2$, respectively, cross-sectional area A of piston 7b is 19.6 cm$^2$, and force F ($=P\times A$) is constantly 98 kg.

According to the first embodiment, furthermore, the timing belt and the lock mechanism are used, so that the operation of the quadric crank chain is secure. If the cylinder mechanism gets out of order, therefore, the test head can be stopped safely, thus preventing an accident.

Figure 9:
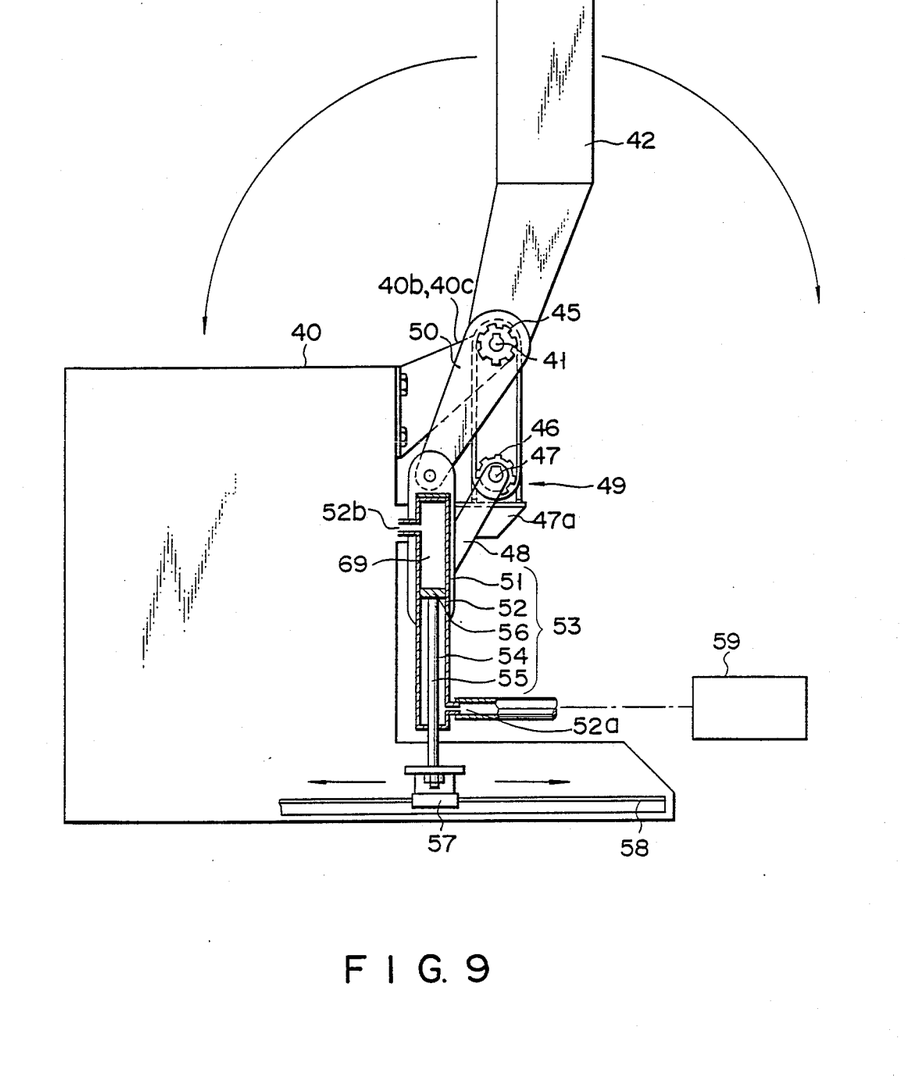
FIG. 9 is a rear view of a mechanism according to a second embodiment of the present invention, illustrating the way a test head is mounted on a wafer prober.
Figure 10:
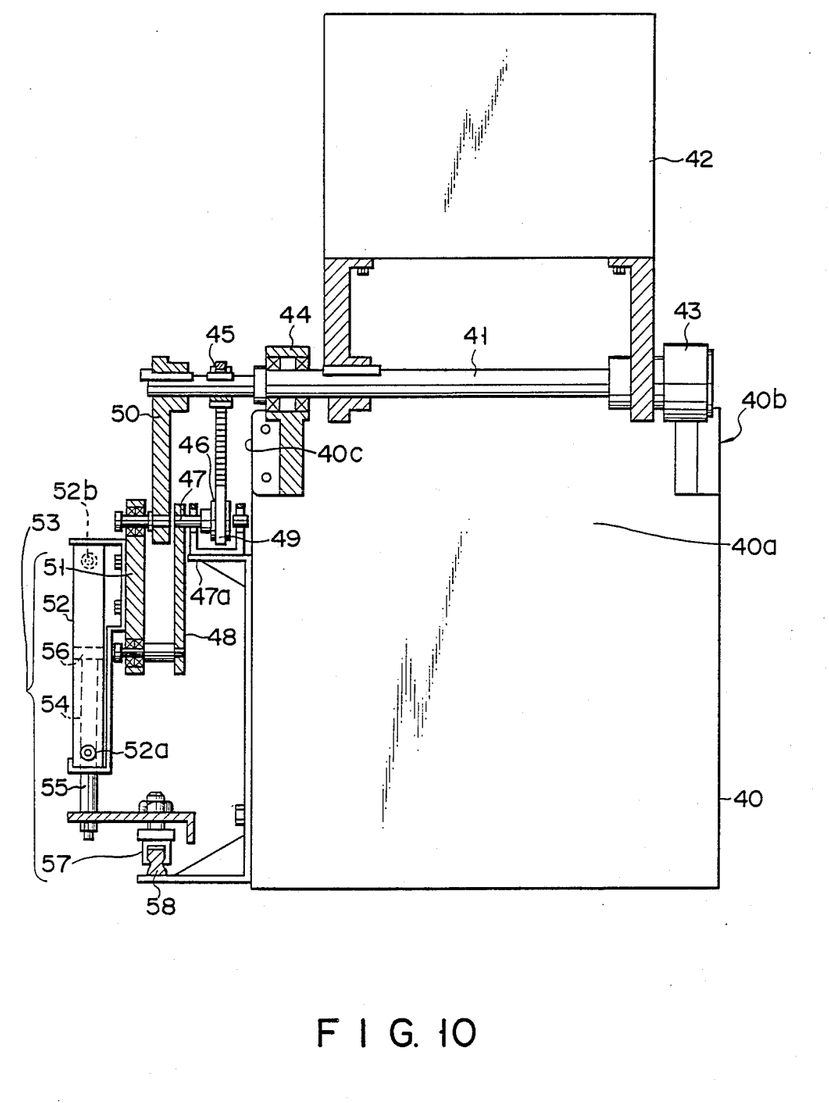
FIG. 10 is a side view of the mechanism for the test head shown in FIG. 9.
Figure 11:
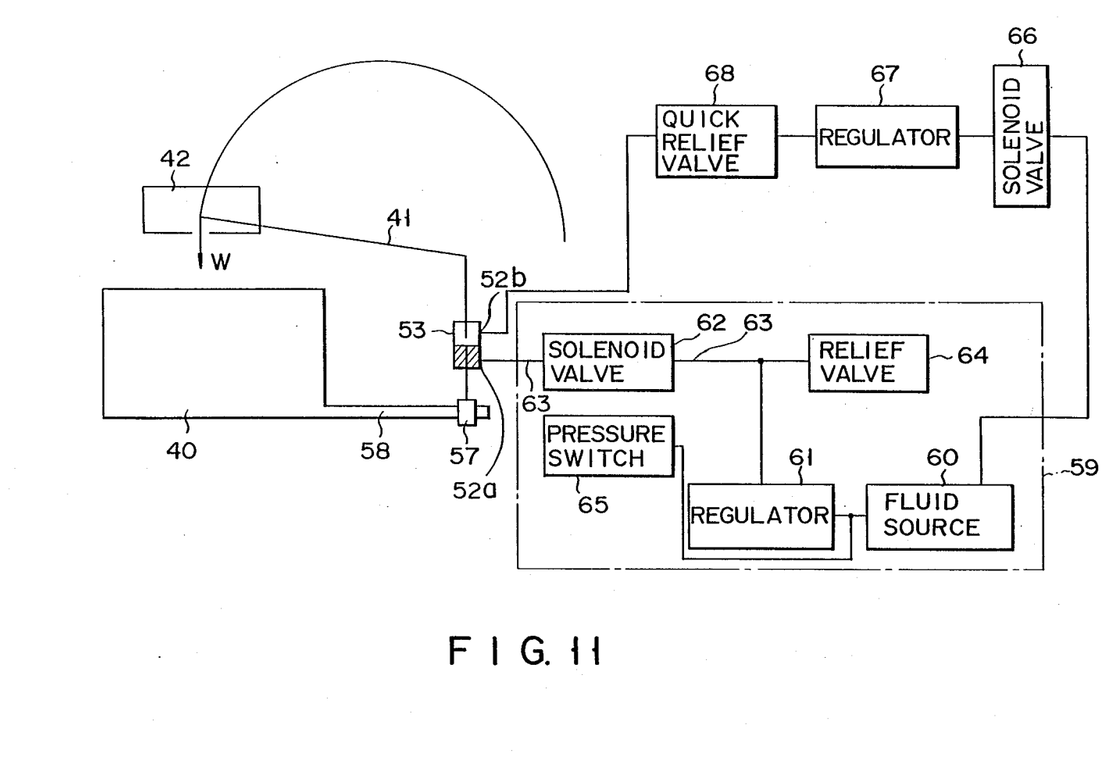
FIG. 11 is a schematic view for illustrating fluid supply means for supplying a fluid to a cylinder mechanism of the mechanism according to the second embodiment.

Referring now to FIGS. 9, 10 and 11, a second embodiment of the present invention will now be described. A repeated description of those portions which are common to the first and second embodiments is omitted herein.

In this second embodiment, cylinder mechanism 53, which constitutes part of the quadric crank chain, is situated lower than timing belt 49 which corresponds to a fixed link of the crank chain. Also, linear guide 57 is attached to the lower end portion of rod 55 of cylinder mechanism 53, and rail 58 is horizontally fixed to the lower front portion of machine 40. Thus, mechanism 53 is guided in a horizontal direction by rail 58.

The quadric crank chain and the cylinder mechanism will now be described in detail. Shaft 41 is horizontally supported on the upper portion of side panel 40a of probing machine 40 by brackets 40b and 40c with the aid of bearings 43 and 44. Test head 42, belt pulley 45, and link 50 are fixed individually to shaft 41. The quadric crank chain, which is composed of parallel links 48 and 50, timing belt 49, and link 51 (part of cylinder mechanism 53), is located on one end side of shaft 41 so as to extend along a front panel of machine 40. Bracket 47a is attached to the front panel of machine 40, and shaft 47 is fixed to bracket 47a. Belt pulley 46 is fitted on fixed shaft 47, and belt 49 is passed around pulleys 45 and 46. Thus, the positions of pulleys 45 and 46 relative to machine 40 are fixed, so that timing belt 49 serves as the fixed link of the crank chain, while other links 48, 50 and 51 can swing around shafts 41 and 47.

Cylinder 52 of mechanism 53 is fixed to link 51. It is a double-acting cylinder 52 having two port 52a, 52b. The inside of a cylinder chamber is divided into upper and lower compartments by a piston 56. When a fluid, such as compressed air, from fluid supply means 59 is fed or sucked into the lower compartment via lower port 52a, fed or sucked into the upper compartment via upper port 52b, rod 55, along with piston 56, is moved up and down by the difference in pressure between the upper and lower compartments. Lower port 52a is situated below the lower dead point of piston 56, while upper port 52b is situated above the upper dead point of the piston. Linear guide 57, which is attached to the lower end portion of rod 55, as mentioned before, slides along rail 58 which is horizontally fixed to machine 40.

As shown in FIG. 11, fluid source 60 of fluid supply means 59 is provided with regulator 61 and solenoid valve 62, and is connected to lower port 52a of cylinder mechanism 53 by means of pipe 63. Valve 62 has pressure switch (pressure sensor) 65, which detects the internal static pressure of pipe 63 for the on-off control of valve 62, and controls the operations of valve 62 and cylinder 29 (see FIG. 8) of the aforementioned lock mechanism in association with each other. Thus, if the internal static pressure of pipe 63 is lowered due to its breakage or other trouble, the lock mechanism functions, and solenoid valve 62 is switched on. Fluid supply means 59 includes relief valve 64. If the internal static pressure of pipe 63 exceeds a predetermined pressure level, the fluid in the pipe is discharged through valve 64 to the outside.

The following is a description of the way test head 42 on machine 40 is rotatively transferred to the side of a side desk by means of the rotary transfer mechanism according to the second embodiment mentioned above.

Test head 42 is released from clamping, solenoid valve 62 is opened to allow the fluid in the lower compartment of cylinder 52 to be sucked in, and shaft 41 is unlocked. Thereupon, cylinder 52 slides toward machine 40 while ascending, so that head 42, along with link 50 of the quadric crank chain, swings in the clockwise direction of FIG. 9. When piston 52 reaches its upper dead point, that is, when head 42 is in an upright posture, the fluid is fed into upper port 52b and the fluid of the lower compartment of cylinder 52 is discharged, causing the cylinder to be raised. As a fluid feeding means, fluid supply means is provided for feeding a fluid via electromagnetic valve 66, regulator 67 and quick release valve 68 into upper port 52b (see FIG. 11). Regulator 67 controls the speed of cylinder 52, that is, the lowering speed of the test head. The quick release valve 68 quickly exhausts air present in upper compartment 69 of cylinder 52 when that air is supplied into lower port 52a. As a result, test head 42, along with shaft 41, is turned reversely for 180° from its initial state, to be placed on the side desk.

According to the second embodiment described above, the quadric crank chain can enjoy a more compact design. Thus, a dust cover can be so small that it constitutes no hindrance to the test work.

According to the present invention, manual operation of a high-frequency test head can be achieved without such a hindrance as has conventionally been encountered. A high-frequency test head for testing high-integration device patterns, in particular, weighs more than 100 kg, and is not, therefore, very easy to handle. The mechanisms of the present invention, however, enable the test head of this type to be handled securely with speed and safety. Thus, the wafer test program can be quickly executed to ensure improved productivity of semiconductor devices.

Although, in the aforementioned embodiments, the present invention has been explained as being applied to the movement of the test head of the wafer prober, it may equally be applied to a mechanism for moving a test head, such as of a printed board, semiconductor IC circuit and LCD. This invention may also be applied to the movement of not only the test heads but also the other casing or cover unit.

What is claimed is:

1. A mechanism for turning over a heavyweight object, comprising:
   a quadric crank chain disposed substantially within a vertical plane to support an object of transfer;
   slide means coupled to a first movable link corresponding to the side opposite to a fixed link of the quadric crank chain, said sliding means serving to slide the first movable link in vertical direction; and
   guide means for supportingly guiding the slide means in a horizontal direction,
   said object of transfer being attached to a second movable link corresponding to a side adjacent to the fixed link of the quadric crank chain, so that the object of transfer, along with the second movable link, revolves within the vertical plane when the first movable link slides vertically.

2. The mechanism according to claim 1, wherein said object of transfer is a high-frequency test head for a wafer test.

3. The mechanism according to claim 1, wherein said second movable link is located on the upper side of the quadric crank chain.

4. The mechanism according to claim 1, wherein said slide means is a cylinder mechanism.

5. The mechanism according to claim 4, wherein said cylinder mechanism includes a single-acting cylinder.

6. The mechanism according to claim 4, wherein said cylinder mechanism includes means for controlling the static pressure of a working fluid of the cylinder mechanism in accordance with a load introduced into the cylinder mechanism through the quadric crank chain.

7. The mechanism according to claim 4, wherein said pressure control means includes a solenoid valve, a pressure sensor, a regulator, and a relief valve.

8. The mechanism according to claim 4, wherein said working fluid of the cylinder mechanism is air.

9. The mechanism according to claim 4, wherein said working fluid of the cylinder mechanism is oil.

10. The mechanism according to claim 4, wherein said guide means for supportingly guiding the cylinder mechanism in the horizontal direction includes a roller attached to a piston rod of a cylinder and a guide rail for the travel of the roller.

11. The mechanism according to claim 5, wherein said guide means for supportingly guiding the doubleacting cylinder mechanism in the horizontal direction includes a linear guide attached to the cylinder and a guide rail for the slide of the linear guide.

12. The mechanism according to claim 1, wherein said fixed link of the quadric crank chain is fitted with a timing belt so that the timing belt engages a ratchet wheel on a pivotal shaft connecting the fixed link and the second movable link.

13. The mechanism according to claim 12, wherein said ratchet wheel on the pivotal shaft is provided with a lock mechanism.

14. The mechanism according to claim 1, wherein said first movable link is situated higher than the fixed link.

15. The mechanism according to claim 1, wherein said first movable link is situated lower than the fixed link.

16. A wafer probing machine, comprising:
a wafer cassette table;
means for taking a wafer out of a cassette, conveying the wafer to a main chuck, and mounting the wafer on the main chuck;
means for automatically adjusting the position of the wafer on the main chuck;
a probe card including probes which are brought into contact with pads of chip into the wafer mounted on the main chuck;
a test head, electrically connected to each of the probes of the probe card, for allowing signal transmission between the probes and an electric tester;
a mechanism for turning over the test head;
said mechanism including;
a quadric crank chain disposed substantially within a vertical plane to support an object of transfer;
slide means coupled to a first movable link corresponding to the side opposite to a fixed link of the quadric crank chain, said sliding means serving to slide the first movable link in a vertical direction; and
guide means for supportingly guiding the slide means in a horizontal direction,
said object of transfer being attached to a second movable link corresponding to a side adjacent to the fixed link of the quadric crank chain, so that the object of transfer, along with the second movable link, revolves within the vertical plane when the first movable link slides vertically.

* * * * *